(12) United States Patent
Kim

(10) Patent No.: US 8,358,998 B2
(45) Date of Patent: Jan. 22, 2013

(54) FREQUENCY MIXER

(75) Inventor: Young-Ho Kim, Daejeon (KR)

(73) Assignee: Electronics and Telecommunications Research Institute, Daejon (KR)

( * ) Notice: Subject to any disclaimer, the term of this patent is extended or adjusted under 35 U.S.C. 154(b) by 369 days.

(21) Appl. No.: 12/837,807

(22) Filed: Jul. 16, 2010

(65) Prior Publication Data
US 2011/0151820 A1 Jun. 23, 2011

(30) Foreign Application Priority Data
Dec. 21, 2009 (KR) .................. 10-2009-0128512

(51) Int. Cl.
*H04B 1/26* (2006.01)
(52) U.S. Cl. ...................... 455/313; 455/118
(58) Field of Classification Search .......... 455/313–334, 455/255–265, 91, 118, 115.1, 115.3, 67.11, 455/67.13, 76
See application file for complete search history.

(56) References Cited

U.S. PATENT DOCUMENTS

| | | | |
|---|---|---|---|
| 5,649,312 A * | 7/1997 | Kennan | 455/333 |
| 7,136,622 B2 * | 11/2006 | Rofougaran et al. | 455/118 |
| 7,181,168 B2 * | 2/2007 | Grant et al. | 455/67.11 |
| 7,433,653 B2 * | 10/2008 | Takano et al. | 455/118 |
| 2005/0118979 A1 * | 6/2005 | Langenberg et al. | 455/333 |
| 2007/0026834 A1 * | 2/2007 | Yahagi et al. | 455/313 |

FOREIGN PATENT DOCUMENTS

| | | |
|---|---|---|
| KR | 10-0456238 | 10/2004 |
| KR | 10-0783492 A | 12/2007 |
| KR | 10-0825813 B1 | 4/2008 |

OTHER PUBLICATIONS

Chin-Hsien Yen et al., "A New Low Voltage CMOS Micromixer for 2.45GHz Applications", VLSI International Symposium, pp. 1-3, Apr. 2006.

* cited by examiner

*Primary Examiner* — Lana N Le
(74) *Attorney, Agent, or Firm* — Rabin & Berdo, P.C.

(57) ABSTRACT

A down-conversion frequency mixer includes: a radio frequency (RF) input unit disposed between a VDD line and a GND line and configured to receive an RF signal; an LO input unit configured to receive a carrier frequency (LO) from an internal frequency synthesizer; an intermediate frequency (IF) output unit disposed in parallel to the RF input unit between the VDD line and the GND line and configured to mix the RF signal with the LO signal and output an IF signal; a current generation unit configured to generate a stabilized current without being influenced with noise entered through the VDD line and the GND line; and a noise blocking unit disposed between the VDD line and the RF input unit, between the VDD line and the IF output unit, between the GND line and the RF input unit, and between the GND line and the LO input unit and configured to copy the current generated from the current generator and generate a stabilized current.

10 Claims, 4 Drawing Sheets

FREQUENCY MIXER

CROSS-REFERENCE(S) TO RELATED APPLICATIONS

The present application claims priority of Korean Patent Application No. 10-2009-0128512, filed on Dec. 21, 2009, which is incorporated herein by reference in its entirety.

BACKGROUND OF THE INVENTION

1. Field of the Invention

Exemplary embodiments of the present invention relate to a mixer for converting frequencies in a wireless communication system; and, more particularly, to a frequency mixer that performs a stable operation at a low voltage without being influenced by noise of power lines such as VDD and GND.

2. Description of Related Art

In general, a frequency mixer is one of essential elements in a communication system. Such a mixer converts a high frequency signal to a low frequency signal, or converts a low frequency signal to a high frequency signal.

In early days, a frequency mixer was equipped in a communication system for the purpose of safely transmitting voice, picture, or data in a long distance. Currently, the frequency mixer is essentially used for various purposes in wired or wireless communication systems. In addition to the original purpose of the frequency mixer, the frequency mixer has been used to improve a signal quality, to expand a transmission distance, to overcome an antenna size problem, and to manage channels to accommodate multiple users.

A typical frequency mixer generates a third frequency by mixing two frequencies. Such a typical frequency mixer is generally classified into a frequency mixer for transmitting a signal, and a frequency mixer for receiving a signal.

The frequency mixer for transmitting a signal generates a radio frequency (RF) signal by mixing an intermediate frequency (IF) and a local oscillator (LO) signal. The frequency mixer for receiving a signal generates an IF signal by mixing an RF signal with an LO signal.

Hereinafter, a circuit structure of a typical frequency mixer will be described with reference to FIGS. 1 and 2.

FIG. 1 is a circuit diagram illustrating a single balanced Gilbert mixer, and FIG. 2 is a circuit diagram illustrating a double balanced Gilbert mixer.

The single balanced Gilbert mixer of FIG. 1 uses a single RF signal. Unlike the single balanced Gilbert mixer of FIG. 1, the double balanced Gilbert mixer of FIG. 2 uses differential RF signals.

The double balanced Gilbert mixer of FIG. 2 has a structure more complicated than that of the single balanced Gilbert mixer of FIG. 1. However, the double balanced Gilbert mixer of FIG. 2 has superior isolation characteristics between ports such as RF to LO, LO to RF, RF to IF, and LO to IF. Furthermore, the double balanced Gilbert mixer of FIG. 2 can suppress the generation of spurious or harmonic through signal attenuation of 180° phase difference. Such characteristics of the double balanced Gilbert mixer can alleviate requirements for an external filter. Therefore, the double balanced Gilbert mixer of FIG. 2 has been used more often than the single balanced Gilbert mixer of FIG. 1.

Meanwhile, the isolation characteristic is one of major factors to determine the performance of a frequency mixer. If a signal of one of ports leaks to the other port, the leakage signal may be combined with itself, causing a self-mixing problem. The self-mixing problem generates DC offset that fluctuates an output DC value. The DC offset makes an entire system to abnormally operate. Therefore, the superior isolation characteristic between ports improves the performance of the entire system. Particularly, the isolation characteristic for isolating an RF signal or an LO signal is more important because the RF signal is easily coupled with signals at adjacent lines and an LO signal has the biggest signal level.

The typical frequency mixers shown in FIGS. 1 and 2 are very vulnerable to noise of power lines such as VDD and GND. Such noise is generated at and entered from a printed circuit board (PCB) due to conductive Electro Magnetic Interference (EMI) or radioactive EMI entered from external devices. For example, noises 110 and 210 entered through a VDD line is directly transferred to an output IF port through a current flowing through a load resistor $R_L$. Noises 130 and 230 entered through a GND line is inputted to transistors MN1 and MN2 of an RF input port and the input noises 130 and 230 are also amplified and transferred to the output IF port. Accordingly, the frequency mixers of FIGS. 1 and 2 are very weak to noises of power lines.

Such a power noise problem can be reduced by adding a tail current source. Adding the tail current source can attenuate the influence of the noise entered through power lines. For example, in order to improve the isolation characteristic of an RF port in the frequency mixer of FIG. 2, a tail current source is disposed at the middle without directly connecting sources of RF input transistors MN1 and MN2 with a ground GND. Such a tail current source attenuates the influence of noise entered through the GND line. Therefore, the frequency mixer can obtain a perfect phase difference.

However, the tail current source may distort a signal. For example, a frequency mixer uses very low source voltage such as around 1 V. If a tail current source is added into such a frequency mixer using very low source voltage, the frequency mixer might lower a headroom of a signal. If a signal becomes comparatively little higher, the signal becomes easily saturated. Accordingly, the tail current source may be a burden to dispose in the frequency mixer in view of dynamic range or linearity (IP3) of the frequency mixer.

As described above, adding the tail current source to the frequency mixer is not a perfect solution to blocking the noises of power lines. Accordingly, the typical frequency mixers of FIGS. 1 and 2 are influenced directly from noises of power lines, which are entered from an external device. Such a power line noise is amplified by a variable gain amplifier (VGA) disposed behind the frequency mixer. The amplified noise increases noise figure (NF) and decreases tolerance of an entire system. Therefore, it is required to develop another solution to prevent the power line noise problem.

In addition, the frequency mixers of FIGS. 1 and 2 maintain an operating point by receiving a DC voltage such as $RF_{BIAS}$ and $LO_{BIAS}$ from an additional voltage bias circuit. However, the variability of such individual DC voltage bias is very high and the correlation among RF, LO, and DC bias has not been considered. Accordingly, a driving error of a frequency mixer becomes increased.

Furthermore, an additional voltage bias circuit generally includes resistors arranged in series at a power supply port. Or, the additional voltage bias circuit includes resistors and transistors or transistors only. That is, the voltage bias circuit has a structure easy to leak noise of a power line to a DC bias.

Therefore, there has been a need for developing a circuit to reduce a driving error between frequency mixers and to provide a bias voltage without being influenced by noise of power lines.

SUMMARY OF THE INVENTION

An embodiment of the present invention is directed to a frequency mixer which is not influenced by noise of a power line.

Another embodiment of the present invention is directed to a frequency mixer which maintains superior isolation characteristics of a double balanced Gilbert mixer having a tail current source at a low voltage operation.

Another embodiment of the present invention is directed to a frequency mixer having easy gain control characteristics and improved linearity.

Another embodiment of the present invention is directed to a frequency mixer having reduced driving error.

Another embodiment of the present invention is directed to a frequency mixer having a bias circuit not influenced by noise of a power supply line.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, a frequency mixer includes: a radio frequency (RF) input unit disposed between a VDD line and a GND line and configured to receive an RF signal; an LO input unit configured to receive a carrier frequency (LO) from an internal frequency synthesizer; an intermediate frequency (IF) output unit disposed in parallel to the RF input unit between the VDD line and the GND line and configured to mix the RF signal with the LO signal and output an IF signal; a current generation unit configured to generate a stabilized current without being influenced with noise entered through the VDD line and the GND line; and a noise blocking unit disposed between the VDD line and the RF input unit, between the VDD line and the IF output unit, between the GND line and the RF input unit, and between the GND line and the LO input unit and configured to copy the current generated from the current generator and generate a stabilized current.

DESCRIPTION OF SPECIFIC EMBODIMENTS

Figure 1:
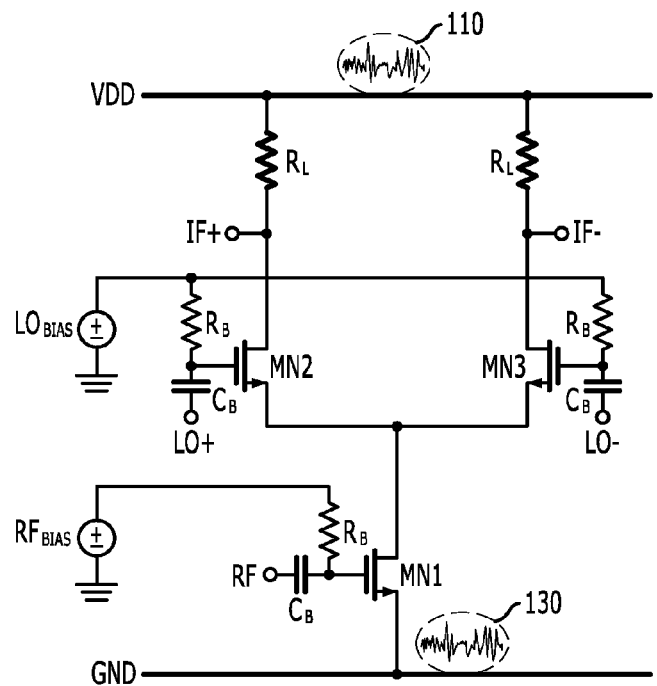
FIG. 1 is a circuit diagram illustrating a single balanced Gilbert mixer.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
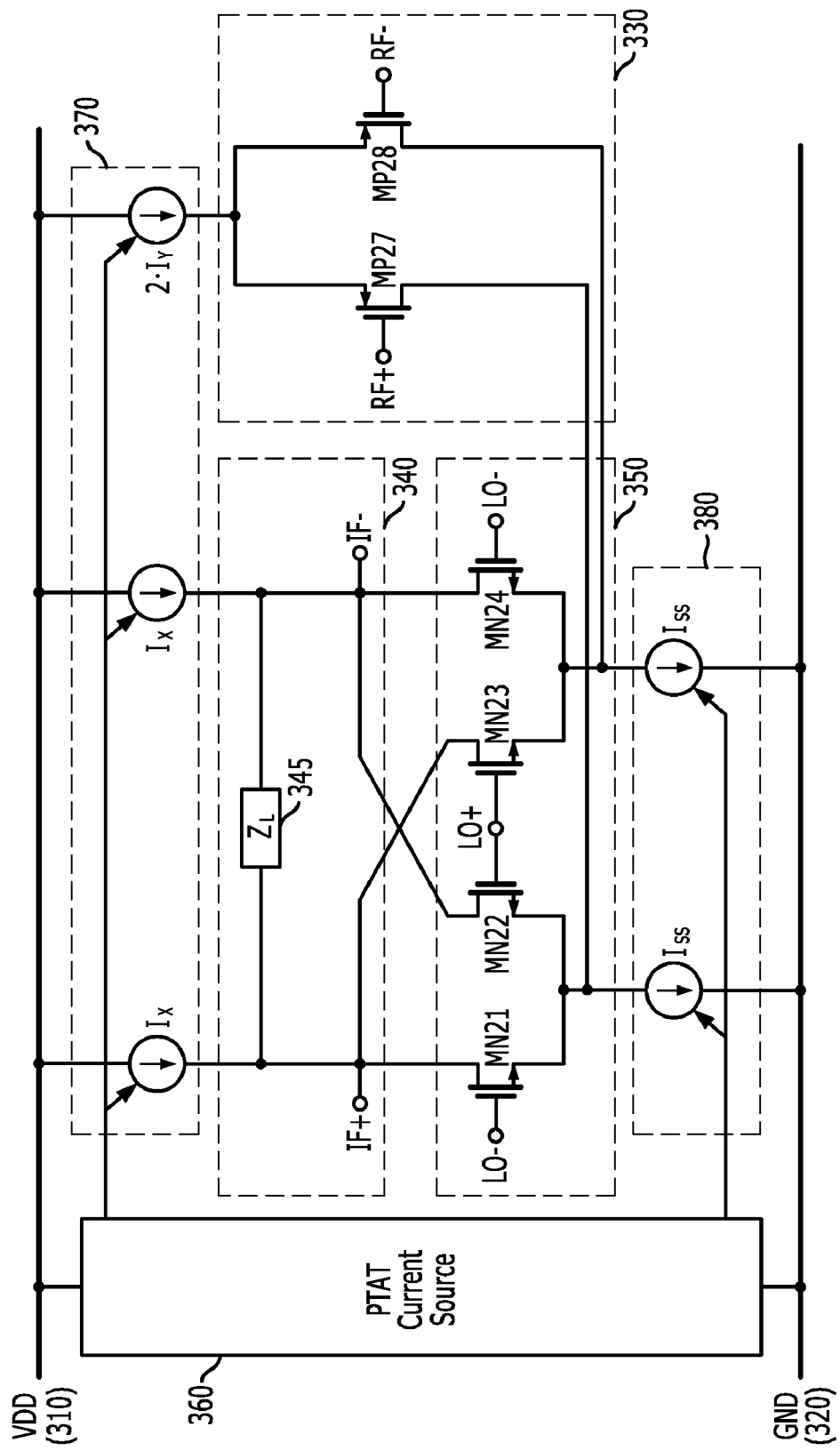
FIG. 3 is a circuit diagram of a frequency mixer in accordance with an embodiment of the present invention.

FIG. 3 is a circuit diagram illustrating a frequency mixer in accordance with an embodiment of the present invention.

As shown in FIG. 3, the frequency mixer in accordance with an embodiment of the present invention includes a radio frequency (RF) input unit 330, an intermediate frequency (IF) output unit 340, a local oscillator (LO) input unit 350, a current generation unit 360, a VDD noise blocking unit 370, and a GND noise blocking unit 380.

Figure 2:
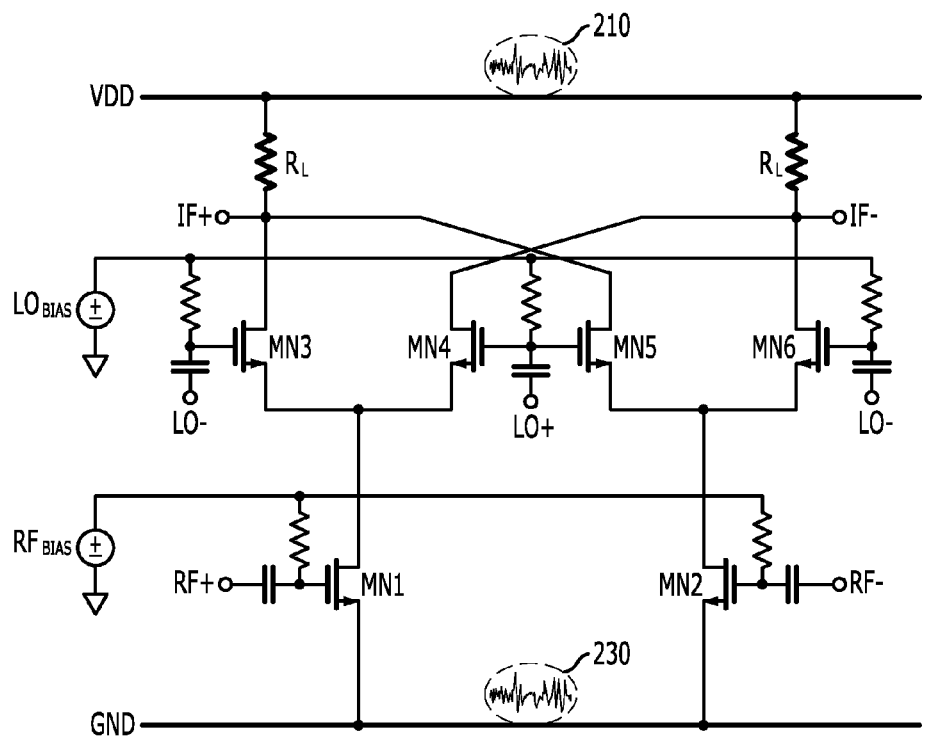
FIG. 2 is a circuit diagram illustrating a double balanced Gilbert mixer.

The IF output unit 340 of the frequency mixer in accordance with the embodiment of the present invention has the same structure of an IF output unit of the double balanced Gilbert mixer of FIG. 2. However, load impedance $Z_L$ 345 of the IF output unit 340 of the frequency mixer in accordance with the embodiment of the present invention is different from that in the double balanced Gilbert mixer of FIG. 2. It will be described hereinafter in detail.

The VDD noise blocking unit 370 is disposed between a VDD line 310 and the IF output unit 340. The GND noise blocking unit 380 is disposed between the GND line 320 and the LO input unit 350. The RF input unit 330 is connected in parallel to the LO input unit 350 between the VDD noise blocking unit 370 and the GND noise blocking unit 380.

The VDD noise blocking unit 370 blocks VDD noise entered through the VDD line 310, and the GND noise blocking unit 380 blocks GND noise entered through the GND line 320. The VDD noise blocking unit 370 and the GND noise blocking unit 380 are a current mirror controlled by a PTAT current generated at the current generation unit 360.

The transistors MN21, MN22, MN23, MN24, MP27 and M2P8 of the frequency mixer in accordance with the embodiment of the present invention are supplied with a mirror current copied through the PTAT current generated from the current generation unit 360.

The current generation unit 360 is embodied as a band gap circuit that is generally used as a temperature compensation circuit. The current generation unit 360 generates a stabilized current that flows through a PN junction device. As the PN junction device, a diode or a bipolar junction transistor (BJT) is commonly used. The current generation unit 360 generates a current in proportion to temperature change through a band gap circuit according to an area of the PN junction device and a magnitude of a current. This current is called a PTAT current which is in proportion to an absolute temperature. The current generation unit 360 mirrors the PTAT current to other circuit stages.

Since the PTAT current generated by the current generation unit 360 is in proportion to an absolute temperature, a current flowing through the PN junctions of the transistors MN21, MN22, MN23, MN24, MP27 and MP28 are constant regardless of noise of the VDD power supply 310 and the GND power supply 320. That is, the constant current, which is not influenced by noise of the VDD power supply 310 and the GND power supply 320, is identically applied to all elements cascoded at the PN junctions of the transistors MN21, MN22, MN23, MN24, MP27 and MP28. That is, power sources $I_X$, $I_{SS}$ and $I_Y$ are mirrored by the current generation unit 360 through a current mirror pair circuit configuration and the power sources $I_X$, $I_{SS}$ and $I_Y$ generate a constant current that is not influenced by the power nodes VDD and GND. Therefore, the frequency mixer in accordance with the embodiment of the present invention safely operates regardless of noise entered to power lines 310 and 320.

As shown in FIG. 2, the RF input unit of the double balanced Gilbert mixer includes NMOS elements MN1 and MN2 cascoded with the LO input unit. Unlike the RF input unit of FIG. 2, the RF input unit 330 of FIG. 3 in accordance with the embodiment of the present invention includes PMOS devices MP27 and MP28 connected in parallel to the LO input unit 350. The GND noise blocking unit 380 can prevent noise entered through the GND line 320 by adding the PTAT mirror current source $I_{SS}$. That is, the GND noise blocking unit 380 can satisfy the purpose of low voltage design because voltage headroom is not occupied.

In addition, the PTAT mirror current source $2I_Y$ is interposed between the transistors MP27 and MP28 of the RF input unit 330 and the VDD power supply 310. Accordingly, noise of the VDD line 310 is prevented from entering to transistors MP27 and MP28 of the RF input unit 330 implemented with a PMOS device.

Moreover, the frequency mixer in accordance with the embodiment of the present invention can have the same superior isolation characteristic of the double balanced Gilbert mixer at a low voltage operation. In other word, the arrangement of the RF input unit 330 in the frequency mixer in accordance with the embodiment of the present invention provides maximum isolation characteristic between ports and occupies less voltage headroom. Accordingly, the frequency mixer has superior linearity and dynamic range.

As shown in FIG. 3, the frequency mixer in accordance with the embodiment of the present invention includes the parallel impedance $Z_L$ 345 instead of a load resistor $R_L$ which is included in the double balanced Gilbert mixer. The load register RL of the double balanced Gilbert mixer decides a gain of the double balanced Gilbert mixer. By including the parallel impedance $Z_L$ instead of the load resistor $R_L$, the frequency mixer in accordance with the embodiment of the present invention can maintain the same output matching and gain of the double balanced Gilbert mixer.

Meanwhile, the PTAT mirror current sources $I_X$, $I_{SS}$ and $I_Y$ have relation shown in Equation Eq. 1 below.

$$I_{SS} = I_X + I_Y (I_Y \gg I_X) \quad \text{Eq. 1}$$

In Equation 1, most of the PTAT current sources $I_X$, $I_{SS}$ and $I_Y$ flow through the RF input unit 330, and a comparatively small amount of the current flows through the transistors MN21, MN22, MN23 and MN24 of the IF output unit 340 which performs the LO switching. This is because the conversion gain of the frequency mixer in accordance with the embodiment of the present invention depends on transconductance ($g_m$) of the RF input unit 330 and the switching property of the LO input unit 350. That is, a gate-source voltage of the switching transistors MN21, MN22, MN23 and MN24 becomes lower as less current flows through the LO input unit 350. Therefore, the LO switching characteristics of the LO input unit 350 becomes better. That is, the transistors can be completely turned on and off even with a small voltage difference. Such an effective switching property improves frequency conversion efficiency and can reduce an excessive ON duration of transistors MN21, Mn22, MN23 MN24 of the LO input unit at the same time. Therefore, the leakage of LO signal can be prevented. When the transistors MN21, MN22, MN23 and MN24 of the LO input unit 350 perfectly performs the switching operation, the output of the frequency mixer in accordance with the embodiment of the present invention can be expressed as Equation 2 below.

$$V_{IF}(t) = \frac{g_m Z_L}{\pi} V_{rf}(t) \cdot \cos(\omega_{rf} - \omega_{LO})t \quad \text{Eq. 2}$$

In Equation 2, $g_m$ denotes transconductance of the transistor MP27 of the RF input unit 330. $V_{rf}$ denotes a voltage of the RF signal input to the RF input unit 330. Therefore, a gain of the frequency mixer in accordance with the embodiment of the present invention can be expressed as the following equation Eq. 3.

$$A_V = \frac{g_m Z_L}{\pi} = \sqrt{2\mu_p C_{ox}\left(\frac{W}{L}\right)_{MP27} \cdot I_Y} \cdot \frac{Z_L}{\pi} = \sqrt{K_p(I_{SS} - I_X)} \cdot \frac{Z_L}{\pi} \quad \text{Eq. 3}$$

In Eq. 3, $\mu_p$ denotes hole-mobility of a PMOS device of the RF input unit 330. $C_{OX}$ is a capacitance per an area of gate oxide. W/L is a size of transistors MP27 and MP28. $K_p$ is $2\mu_p C_{OX}$ (W/L).

Therefore, in order to increase the gain of the frequency mixer in accordance with the embodiment of the present invention, it is necessary to increase the size (W/L) of the transistors MP27 and MP28 or the current $I_Y$ of the RF input port so as to increase $Z_L$ 345 or the transconductance ($g_m$) of the RF input unit 330, as expressed in Equation 3 above. In particular, the frequency mixer may be designed to increase the current $I_Y$ and decrease the current $I_X$ in consideration of the gain of the frequency mixer, the LO switching property, and the IP3.

Figure 4:
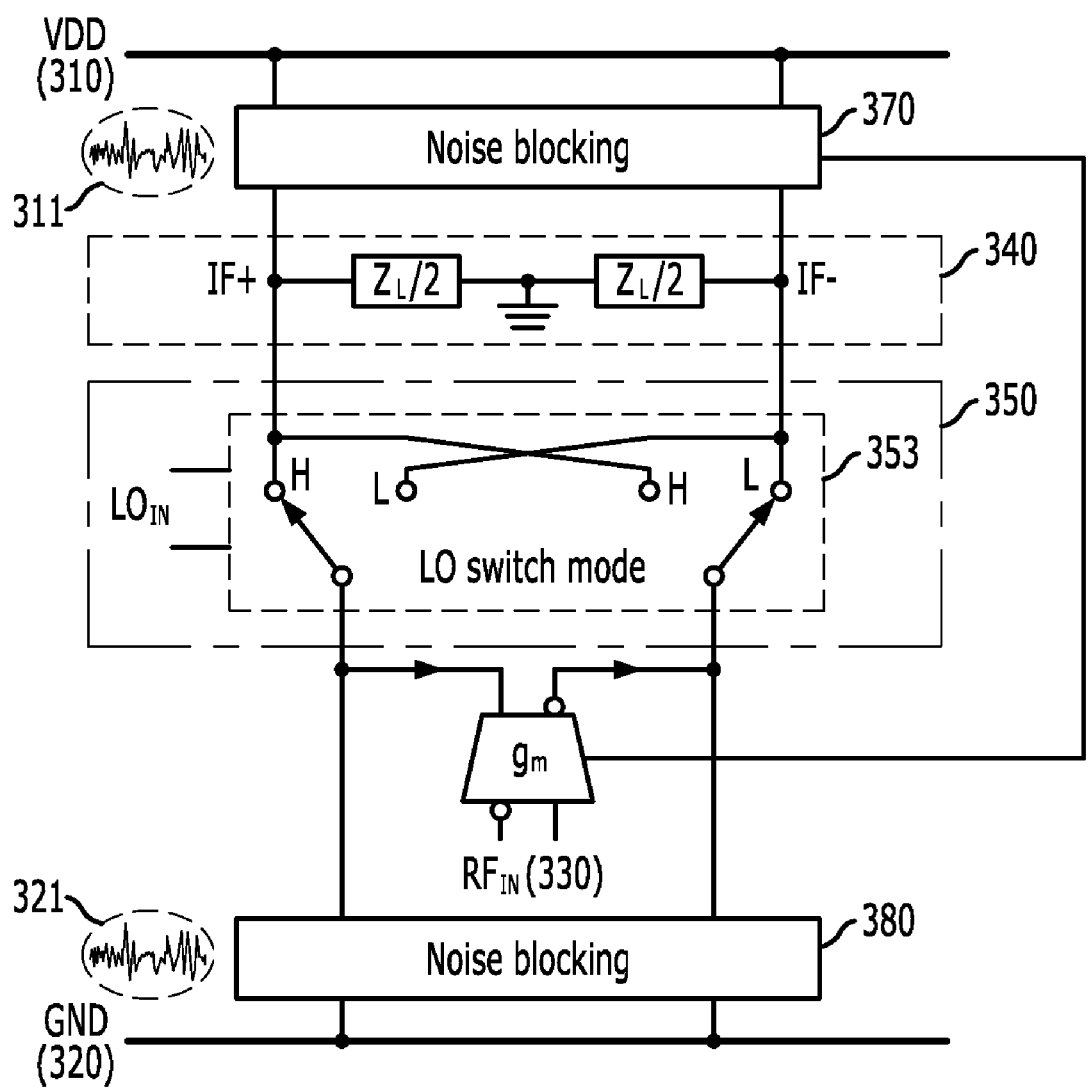
FIG. 4 is a block diagram for explaining operation of a frequency mixer in accordance with an embodiment of the present invention.

FIG. 4 is an operation modeling schematically explaining the operation of the frequency mixer of FIG. 3 in accordance with embodiment of the present invention.

As shown in FIG. 4, an RF signal inputted to the RF input unit 330 is converted into a small signal current amplified by $g_m$ through the transconductors (W/L$_{MP27, MP28}$, 2IY). The current whose frequency is converted by the double balanced LO switching unit is transferred to the IF output ports IF+ and IF−. A differential mixing current transferred to the IF output ports 340 is combined with load impedance $Z_L/2$ and then outputted as a voltage.

The RF input transistor of the RF input unit 330 is a PMOS device and has a transconductance smaller than that of an NMOS device having the same size. Therefore, the RF input transistor may have 2-3 times the size of the NMOS device.

Also, large transistors may be used for the LO switching unit 353 to increase sensitivity of a switching mode because a comparatively small current flows the LO switching unit 353.

Furthermore, a ratio of a PTAT current mirror $I_X$ and a PTAT current mirror $I_Y$ should be properly controlled to find the best gate-source voltage point having proper gain and superior switching efficiency. Under assumption of perfect switching operation, the LO switching unit performs a high digital operation H when a potential difference of differential LO input waves is a positive value, and the LO switching unit performs a low digital operation L when the potential difference is a negative value. The LO switching unit is designed to have a duty rate of digital level H and L of the LO switching unit 353 as 0.5.

Meanwhile, since the noise blocking units 370 and 380 include PTAT current mirrors, the noise blocking units 370 and 380 operate independently from noises 311 and 321 of VDD and GND lines 310 and 320.

Figure 5:
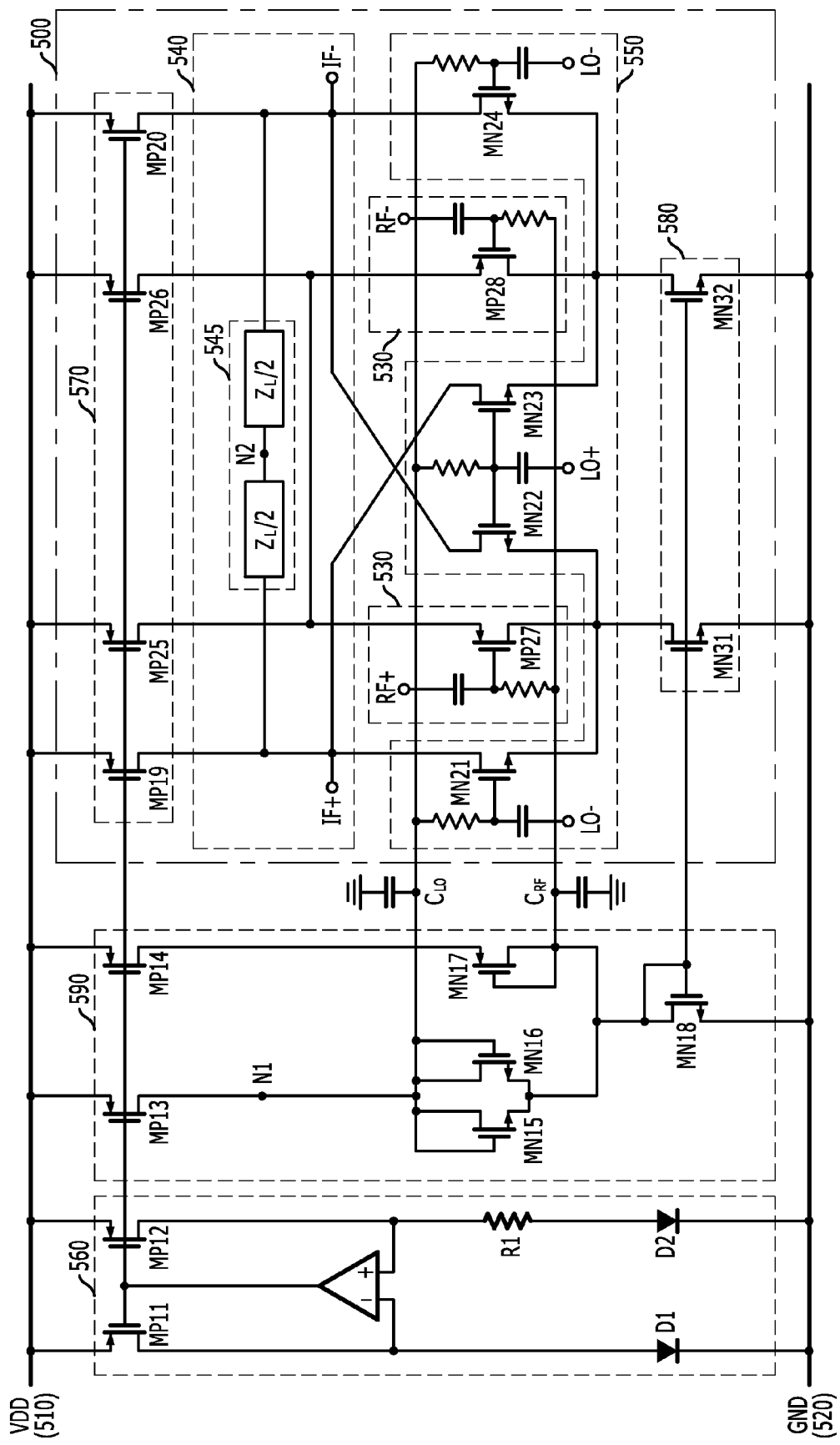
FIG. 5 is a circuit diagram illustrating a frequency mixer in accordance with another embodiment of the present invention.

FIG. 5 is a circuit diagram illustrating a frequency mixer in accordance with another embodiment of the preset invention.

Referring to FIG. 5, the frequency mixer in accordance with another embodiment of the present invention includes a current generation unit 560, a bias unit 590 independent from power noise, and a frequency mixer core unit 500.

The current generation unit 560 includes a typical band gap circuit which is generally used as a temperature compensation circuit. The current generation unit 560 outputs a stabilized current that flows through a PN junction device. The current generation unit 560 includes a mirroring pair structure in order to output a proportional mirror current. A diode or a bipolar junction transistor (BJT) is used as the PN junction device. The current generation unit 560 generates a current in proportion to a temperature difference through a band gap circuit according to an area of the PN junction or magnitude of a current. Such a current is called a PTAT current. That is, the current generation unit 560 mirrors a current in proportion to an absolute temperature through an active mirror structure implemented with transistors MP11 and MP12 and an amplifier to the other stage.

The bias unit 590 provides a bias voltage to the RF input unit 530 and the LO input unit 550 of the frequency mixer core unit 500.

The bias unit 590 has a replica bias structure as a half structure of the frequency mixer core unit 500. The frequency mixer core unit 500 has a symmetrical structure. That is, the transistors MN18, NM15, MN16, MP17, MP13 and MP14 of the bias unit 590 is symmetrical with a structure having transistors MN31, MN21, MN22, MP27, MP19 and MP25 or a structure including transistors MN32, MN23, Mn24, MP28, MN26 and MP20.

In the bias unit 590, the transistor MP17 provides a bias voltage to the RF input unit 530. The transistors MN15 and MN16 provides a bias voltage to the LO input unit 550. The transistor MN18 provides a PTAT tail current to the GND noise blocking unit 580. Such transistors NP17, MN15, MN16, and MN18 are electrically connected to a gate and a drain in a diode-connected structure. The transistors stabilize the bias voltage of each nose.

Such a replica bias structure has the same transistor size and current value to transistors used in the frequency mixer core unit 500.

Hereinafter, the bias unit 590 will be described in more detail.

The transistors MP13 and MP14 receive a PTAT current generated from the current generation unit 560 and provide an operation current to a bias unit.

The transistors MN15 and MN16 have a diode-connected structure and provide a gate bias to differential pair transistors MN21 and MN22 and MN23 and MN24 in the LO input unit 550 of the frequency mixer core unit 500.

The transistor MP17 also has a diode-connected structure and provides a gate bias to each of transistors MP27 and MP28 in the RF input unit 530 of the frequency mixer core unit 500.

The transistor MN18 has a diode-connected structure and generates a PTAT tail current mirrored to each of transistors MN31 and MN32 arranged in the GND noise blocking unit 580 of the frequency mixer core unit 500. Also, the transistor MN18 is a mirror pair having the same size of the transistors MN31 and MN32. A current flowing to source-drain terminals of the transistor MN18 is same as the sum of current flowing to the source-drain terminals of the transistors MP13 and MP14. Therefore, the sum of current flowing the transistors MP13 and MP14 is same to the sum of currents flowing the transistors MP19, MP25, MP26 and MP20.

In the frequency mixer core unit 500, an RF signal inputted to the RF input unit 530 and an LO signal inputted to the LO input unit 550 are coupled and transferred to a capacitor. The bias is provided from the bias unit 590 through a large bias resistor. The bias resistor may be replaced with an inductor.

The bias resistor (or inductor) forms a low pass filter with capacitors CL0 and CRF between the bias unit 590 and the frequency mixer core unit 500. That is, the bias resistor prevents the deterioration of isolation characteristics between ports by bypassing the LO signal and the RF signal through the bias unit 590.

The load impedance 545 may be formed as an LC resonator for gain matching or may be implemented with a passive resistor R or an active resistor (for example, MOSFET device). In order to safely maintain a DC voltage of an output port, a voltage of a node N2 receives a stabilized bias through an additional reference voltage circuit. The node N2 may be connected to a node N1 of the bias unit 590. However, it is necessary to properly control a $C_{LO}$ value to prevent an IF signal to enter to the LO input unit 550.

In the frequency mixer in accordance with the embodiment of the present invention, transistors having a current mirror pair structure may have a long channel length (L: channel length of MOSFET) to properly block noises and to reduce an error of mirror current.

As described above, the influence of power line noise can be reduced by using the frequency mixer in accordance with the embodiment of the present invention.

Furthermore, the frequency mixer in accordance with the embodiment of the present invention can maintain the superior isolation characteristic of the double balanced Gilbert mixer at a low-power system.

Since a transconductor of an RF input unit is formed independently, a current flowing through the IF output unit and a current flowing through the RF input unit can be independent controlled. Therefore, the frequency mixer in accordance with the embodiment of the present invention can easily control the gain and improve the linearity.

In addition, a driving error can be reduced.

Moreover, a frequency mixer having a bias circuit not influenced by power line noise can be provided.

While the present invention has been described with respect to the specific embodiments, it will be apparent to those skilled in the art that various changes and modifications may be made without departing from the spirit and scope of the invention as defined in the following claims.

What is claimed is:

1. A down-conversion frequency mixer, comprising: a radio frequency (RF) input unit disposed between a VDD line and a GND line and configured to receive an RF signal; an LO input unit configured to receive a carrier frequency (LO) from an internal frequency synthesizer; an intermediate frequency (IF) output unit disposed in parallel to the RF input unit between the VDD line and the GND line and configured to mix the RF signal with the LO signal and output an IF signal; a current generation unit configured to generate a stabilized current without being influenced with noise entered through the VDD line and the GND line; and a VDD noise blocking unit disposed between the VDD line and the RF input unit and between the VDD line and the IF output unit;

a GND noise blocking unit disposed between the GND line and the RF input unit and between the GND line and the LO input unit;

wherein the VDD and GND noise blocking units are configured to copy the current generated from the current generator and generate a stabilized current.

2. The down-conversion frequency mixer of claim 1, wherein the RF input unit includes two PMOS transistors connected to two current sources of the VDD noise blocking unit to thereby form a differential pair structure, drains of the PMOS transistors being connected to two current sources of the GND noise blocking unit, the RF input unit being connected in parallel to a source of a transistor of the LO input unit, and the LO input unit connected in parallel to the RF input unit includes two NMOS transistors in a differential pair structure, drains of the NMOS transistors being respectfully connected to the IF output unit, the IF output unit having differential outputs (IF+ and IF−) like a double balanced Gilbert mixer, two current sources of the VDD noise blocking unit being connected to the IF output unit, and load impedance being formed between an IF+ output port and an IF− output port of the IF output unit in parallel, thereby forming a core structure.

3. The down-conversion frequency mixer of claim 2, further comprising a bias unit configured to provide a bias voltage to input ports of the LO input unit and the RF input unit,
wherein the bias unit has a replica bias structure as a half structure of the core structure, the replica bias structure has a same transistor size to transistors used in the core structure, and a current identical to a current flowing through transistors used in the core structure flows through the bias unit.

4. The down-conversion frequency mixer of claim 1, wherein the current generation unit includes a band gap circuit.

5. The down-conversion frequency mixer of claim 1, wherein a size of a current mirror of the VDD noise blocking unit disposed between the VDD line and the RF input unit is greater than a size of a current mirror of the VDD noise blocking unit disposed between the VDD line and the IF output unit.

6. An up-conversion frequency mixer comprising: an intermediate frequency (IF) input unit disposed between a VDD line and a GND line and configured to receive an IF signal; an LO input unit configured to receive a carrier frequency (LO) signal from an internal frequency synthesizer; a radio frequency (RF) output unit disposed in parallel to the IF input unit between the VDD line and the GND line and configured to mix the input IF signal with the LO signal and output an RF signal; a current generation unit configured to generate a stabilized current without being influenced by noise entered through the VDD line and the GND line; and
a VDD noise blocking unit disposed between the VDD line and the IF input unit and between the VDD line and the RF output unit;
a GND noise blocking unit disposed between the GND line and the IF input unit and between the GND line and the LO input unit;
wherein the VDD and GND noise blocking units are configured to copy the generated current from the current generation unit and generate a stable current.

7. The up-conversion frequency mixer of claim 6, wherein the IF input unit comprises two PMOS transistors connected to two current sources of the VDD noise blocking unit to thereby form a differential pair structure, drains of the PMOS transistors being connected to two current sources of the GND noise blocking unit, the IF input unit being connected in parallel to a source of a transistor of the LO input unit, and the LO input unit connected in parallel to the IF input unit includes two NMOS transistors in a differential pair structure, drains of the NMOS transistors being respectfully connected to the RF output unit, the RF output unit having differential outputs (RF+ and IF−) like a double balanced Gilbert mixer, two current sources of the VDD noise blocking unit being connected to the RF output unit, and load impedance being formed between an RF+ output port and an RF− output port of the IF output unit in parallel, thereby forming a core structure.

8. The up-conversion frequency mixer of claim 7, further comprising a bias unit configured to provide a bias voltage to input ports of the LO input unit and the IF input unit,
wherein the bias unit has a replica bias structure as a half structure of the core structure, the replica bias structure has a same transistor size to transistors used in the core structure, and a current identical to a current flowing through transistors used in the core structure flows through the bias unit.

9. The up-conversion frequency mixer of claim 6, wherein the current generator comprises a band gap circuit.

10. The up-conversion frequency mixer of claim 6, wherein a size of a current mirror of the VDD noise blocking unit disposed between the VDD line and the IF input unit is greater than a size of a current mirror of the VDD noise blocking unit disposed between the VDD line and the RF output unit.

* * * * *